(12) United States Patent
Miyajima

(10) Patent No.: US 8,723,244 B2
(45) Date of Patent: May 13, 2014

(54) SEMICONDUCTOR DEVICE HAVING STORAGE ELECTRODE AND MANUFACTURING METHOD THEREOF

(76) Inventor: Takashi Miyajima, Tokyo (JP)

(*) Notice: Subject to any disclaimer, the term of this patent is extended or adjusted under 35 U.S.C. 154(b) by 346 days.

(21) Appl. No.: 12/458,912

(22) Filed: Jul. 27, 2009

(65) Prior Publication Data

US 2010/0052098 A1 Mar. 4, 2010

(30) Foreign Application Priority Data

Jul. 28, 2008 (JP) .................. 2008-193389

(51) Int. Cl.
*H01L 27/108* (2006.01)

(52) U.S. Cl.
USPC ..... 257/308; 257/306; 257/532; 257/E23.144

(58) Field of Classification Search
USPC .................... 257/306–309, 532, E23.144
See application file for complete search history.

(56) References Cited

U.S. PATENT DOCUMENTS

| | | | |
|---|---|---|---|
| 5,622,883 A | 4/1997 | Kim | |
| 6,929,999 B2 | 8/2005 | Park et al. | |
| 7,745,868 B2 | 6/2010 | Ohuchi | |
| 2006/0086952 A1* | 4/2006 | Kim et al. | 257/211 |
| 2008/0121960 A1* | 5/2008 | Ohuchi | 257/296 |

FOREIGN PATENT DOCUMENTS

| | | |
|---|---|---|
| GB | 2 400 236 A | 10/2004 |
| JP | H08-330542 A | 12/1996 |
| JP | H09-321241 A | 12/1997 |
| JP | 2004-221595 A | 8/2004 |
| JP | 2004-311918 | 11/2004 |
| JP | 2006-190979 A | 7/2006 |
| JP | 2008-130981 A | 6/2008 |

* cited by examiner

*Primary Examiner* — Matthew E Warren
(74) *Attorney, Agent, or Firm* — McGinn IP Law Group, PLLC

(57) ABSTRACT

A semiconductor device includes a first storage electrode, a second storage electrode, a first landing pad, a capacitive insulating film, and a plate electrode. The second storage electrode is arranged above the first storage electrode. The first landing pad is arranged between a top surface of the first storage electrode and a bottom surface of the second storage electrode. The first landing pad connects the first storage electrode and the second storage electrode. The first landing pad has a first landing surface larger than the bottom surface of the second storage electrode. The second storage electrode is placed on the first landing surface. The capacitive insulating film is laminated on the first and second storage electrodes and on an outer circumferential surface of the first landing pad. The plate electrode contacts the capacitive insulating film.

20 Claims, 12 Drawing Sheets

SEMICONDUCTOR DEVICE HAVING STORAGE ELECTRODE AND MANUFACTURING METHOD THEREOF

BACKGROUND OF THE INVENTION

1. Field of the Invention

The present invention relates to a semiconductor device having a storage electrode and a manufacturing method thereof.

Priority is claimed on Japanese Patent Application No. 2008-193389, filed Jul. 28, 2008, the content of which is incorporated herein by reference.

2. Description of Related Art

Accompanying developments in miniaturization and high-integration of DRAM, the size of capacitor elements that form a memory cell has also been reduced. Consequently, it is becoming more difficult to ensure a sufficient amount of accumulated charge. In order to improve capacitor capacity, there is a need to expand the surface area of the capacitor elements. Therefore, as a stack type capacitor element, there has been developed a capacitor having a cylindrical (cylinder-shaped) lower electrode.

As capacitor elements become miniaturized, the diameter of the cylinder opening of the cylindrical lower electrode and its surface area is reduced. As a result, the capacitor capacity becomes smaller. Consequently, in order to ensure capacitor capacity, in simple terms, the height of the lower electrode needs to be heightened to thereby increase the surface area.

However, we have now discovered that there has been a problem in that if an attempt is made so that the height of the lower electrode is ensured and a cylinder shape is formed in the deep section of the lower electrode, defects will occur in the dry etching because the aspect ratio of the lower electrode is high. That is to say, etching gas is unlikely to penetrate into the deep section of the lower electrode, and the control of dry etching becomes more difficult. Consequently, thre is a possibility that the cylinder opening becomes defective and the shape of the lower electrode becomes unstable. Furthermore, there is a possibility that if the shape of the lower electrode becomes unstable, the lower electrode may collapse, causing a short failure between adjacent electrodes.

Japanese Unexamined Patent Application, First Publication No. 2004-311918 (hereinafter, referred to as Patent Document 1) discloses a semiconductor device in which there is provided a two-stage structure in a lower electrode of a capacitor to thereby enable a reduction in dry etching defects. That is to say, Patent Document 1 discloses a semiconductor device in which, as shown in FIG. 15 of Patent Document 1, in an interlayer insulating film 102 with an etching stopper film 10 formed thereon, there is formed a storage node contact plug 104. This semiconductor device has a capacitor lower electrode 106 having a two-stage structure of a pad-shaped storage node (first storage electrode) 40 formed so as to connect to the storage node contact plug 104, and a cup-shaped storage node (second storage electrode) 70 formed thereon. As a result, the capacitor lower electrode 106 is formed high and the capacitor capacity is ensured, and only the second storage electrode 70 is formed in a cup shape. Therefore, it is alleged to be possible to reduce defects in dry etching, that is, defects in the opening, or defects in the shape of the capacitor lower electrode 106.

However, we have recognized that even in the case of using the two-stage structured capacitor lower electrode 106 shown in FIG. 15 of Patent Document 1, with further miniaturization of the device, the influence of superposition displacement in lithography becomes significant. Therefore, there is a possibility that again defects such as collapse of the capacitor and deterioration in the capacitor characteristic may occur. A problem in the conventional art is more specifically described with reference to FIG. 21. FIG. 21 is illustrated by adding to FIG. 15 of Patent Document 1 which discloses the conventional art a phenomenon which causes the problem discovered by the present inventor.

As shown in FIG. 21, when forming the two-stage structured capacitor lower electrode 106, the positions of the pad-shaped storage node (first storage electrode) 40 and the cup-shaped storage node (second storage electrode) 70 may be displaced from each other in some cases due to superposition displacement in lithography. In this case, there is a problem in that the contact area between the first storage electrode 40 and the second storage electrode 70 is reduced. As a result there is a possibility that the mechanical strength of the capacitor lower electrode 106 is reduced and the second storage electrode 70 consequently collapses, causing short-circuit between the adjacent capacitor lower electrodes. Moreover, there is a possibility that even if a short-circuit does not occur, since stress is applied to the capacitive insulating film that coats the capacitor lower electrode 106, leakage current may increase.

SUMMARY

In one embodiment, there is provided a semiconductor device that includes: a first storage electrode; a second storage electrode that is arranged above the first storage electrode; a first landing pad that is arranged between a top surface of the first storage electrode and a bottom surface of the second storage electrode, the first landing pad connecting the first storage electrode and the second storage electrode, the first landing pad having a first landing surface, the first landing surface being larger than the bottom surface of the second storage electrode, and the second storage electrode being placed on the first landing surface.

In another embodiment, there is provided a method for manufacturing a semiconductor device that includes: laminating a first insulating film over a capacitor contact plug; forming a first storage electrode that is embedded in the first insulating film; forming a recess over the first storage electrode in the first insulating film, at the top level of the first insulating film the recess being larger in dimension than the top surface of the first storage electrode; forming a first landing pad in the recess, the first landing pad having a first landing surface; forming a second insulating film that covers the first insulating film and the first landing pad; forming a second storage electrode that is embedded in the second insulating film so that the second storage electrode has a bottom surface that contacts the first landing surface, the bottom surface of the second storage electrode being smaller than the first landing surface.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIGS. 1 to 18 illustrate the embodiments of the present invention. The size, thickness, and dimensions of respective parts shown in the figures may differ from the dimensional relationship of the actual semiconductor device.

First Embodiment

Figure 1:
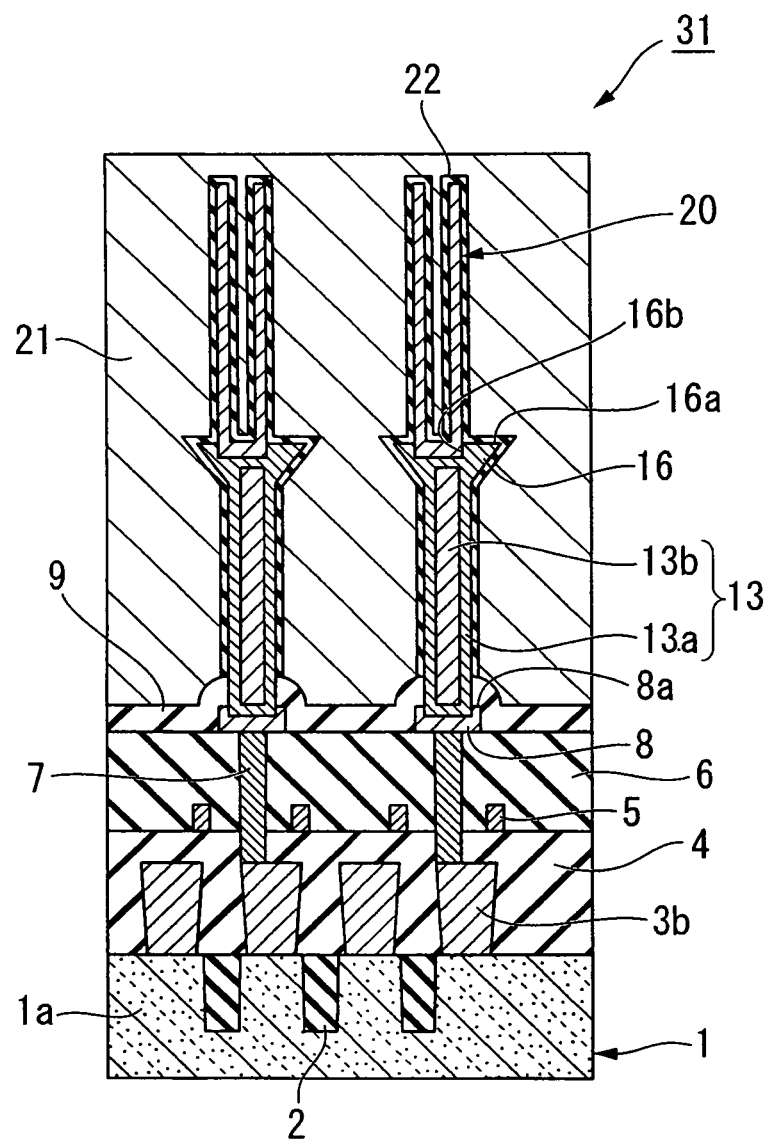
FIG. 1 is a schematic sectional view showing a semiconductor device according to a first embodiment of the present invention.

FIG. 1 is a schematic sectional view showing a semiconductor device according to a first embodiment of the present invention.

Figure 2A:
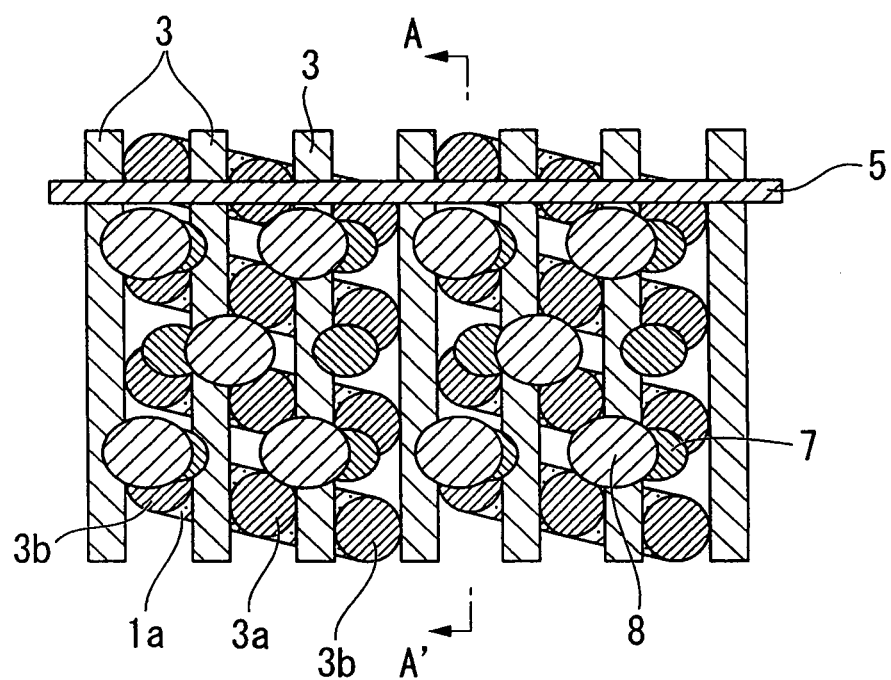
FIG. 2A is a plan view showing a process involved in a method for manufacturing the semiconductor device of the first embodiment.
Figure 2B:
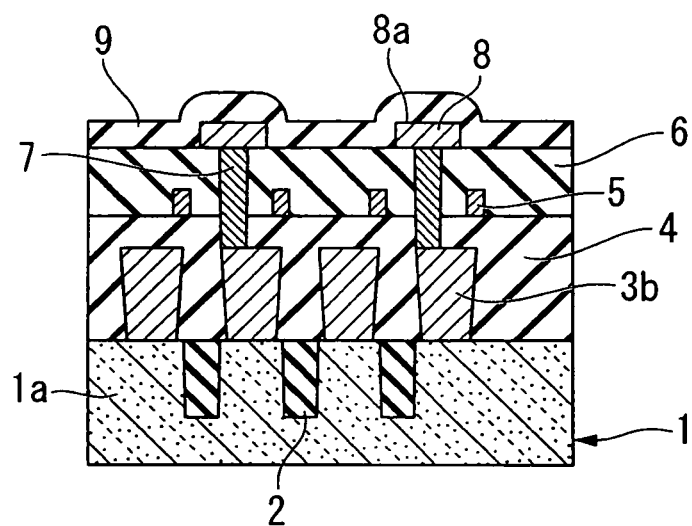
FIG. 2B is a sectional view taken along the line A-A' shown in FIG. 2A.

FIG. 2A to FIG. 9 are views showing processes involved in a method for manufacturing the semiconductor device of the present embodiment. FIG. 2A and FIG. 3A are plan views showing the method for manufacturing the semiconductor device of the present embodiment. FIG. 2B and FIG. 3B respectively show sectional views taken along the line A-A' in FIG. 2A and FIG. 3A. FIGS. 4 to 9 show the structure of the main portion of the semiconductor device of the present embodiment.

First, the semiconductor device of the present embodiment is described. As shown in FIG. 1, a semiconductor device 31 of the present embodiment includes a capacitor including a first storage electrode 13, a second storage electrode 20, an electrode landing pad (first landing pad) 16, a capacitive insulating film 22, and a plate electrode 21. The first storage electrode 13 has a pillar shape, and is formed on a capacitor contact plug 7. The second storage electrode 20 has a crown shape, and is formed above the first storage electrode 13. The electrode landing pad 16 is provided between the first storage electrode 13 and the second storage electrode 20, and has a landing surface 16a for allowing the second storage electrode 20 to land thereon. The landing surface 16a performs as a first landing surface. The capacitive insulating film 22 is laminated on the first storage electrode 13 and the electrode landing pad 16 and the second storage electrode 20. More specifically, the capacitive insulating film 22 is laminated on the outer circumferential surface of the first storage electrode 13 and on the outer circumferential surface of the electrode landing pad 16, and on the outer circumferential surface and the inner circumferential surface of the second storage electrode 20. The plate electrode 21 covers the capacitive insulating film 22. The first storage electrode 13, the electrode landing pad 16 and the second storage electrode 20 constitute a lower electrode.

More specifically, as shown in FIG. 1, in a semiconductor substrate 1 there are formed a plurality of element isolation regions 2, and there are provided active regions 1a. In the semiconductor substrate 1 there is provided a MOS transistor (not shown in the figure). In the active region 1a there is formed a source drain region (not shown in the figure) that constitutes the MOS transistor. To this source drain region there is connected a cell contact plug 3b for a capacitor. Furthermore, there is laminated a first interlayer insulating film 4 so as to coat the active region 1a and the cell contact plug 3b.

The top surface of the first interlayer insulating film 4 is a flat surface, and on this flat surface there is formed a plurality of bit lines 5. On the first interlayer insulating film 4 there is laminated a second interlayer insulating film 6 so as to coat the bit lines 5.

In the second interlayer insulating film 6 there is formed the capacitor contact plug 7 connected to the cell contact plug 3b. Between the top surface of the capacitor contact plug 7 and the bottom surface of the first storage electrode 13, there is arranged a contact landing pad (second landing pad) 8. The contact landing pad 8 has a landing surface 8a for the first storage electrode 13 (second landing surface). The landing surface 8a is larger than the bottom surface of the first storage electrode 13. On the landing surface 8a there is provided a concave section (second concave section), and into this concave section there is inserted the bottom surface of the first storage electrode 13. As a result, the capacitor contact plug 7 and the first storage electrode 13 are connected via the contact landing pad 8.

On the contact landing pad 8 there is formed an etching stopper film 9. The etching stopper film 9, for example, may be made of a silicon nitride film. The bottom surface of the first storage electrode 13 passes through the etching stopper film 9 and is inserted into the concave section on the landing surface 8a. As a result, the mechanical strength of the first storage electrode 13 is improved, and hence the possibility of the first storage electrode 13 being collapsed is reduced.

Between the top surface of the first storage electrode 13 and the bottom surface of the second storage electrode 20 there is arranged the electrode landing pad 16. The electrode landing pad 16 has the landing surface 16a for the second storage electrode 20. The landing surface 16a is larger than the bottom surface of the second storage electrode 20. On a part of the landing surface 16a there is provided a concave section (first concave section) 16b. The bottom surface of the electrode landing pad 16 is formed with a diameter the same as that of the top surface of the first storage electrode 13. The outer diameter of the electrode landing pad 16 gradually increases from the bottom surface toward the top surface. That is to say, the vertical section of the electrode landing pad 16 has a reverse tapered shape as shown in FIG. 1.

The second storage electrode 20 has a crown shape which is a cylindrical shape with a closed bottom end. This second storage electrode 20 is arranged above the first storage electrode 13. The bottom surface of the second storage electrode 20 is inserted into the concave section 16b of the electrode landing pad 16. As a result, the first storage electrode 13 and the second storage electrode 20 are connected via the electrode landing pad 16.

On the outer circumferential surface of the first storage electrode 13 exposed from the etching stopper film 9 and the outer circumferential surface of the electrode landing pad 16, and the outer circumferential surface and the inner circumferential surface of the second storage electrode 20, there is laminated the capacitive insulating film 22. Furthermore, the plate electrode 21 coats this capacitive insulating film 22, thereby configuring a two-stage capacitor of the present embodiment. That is to say, the outer circumferential surface of the first storage electrode 13 and the electrode landing pad 16, and the outer circumferential surface and the inner circumferential surface of the second storage electrode 20, are integrated and function as a storage electrode of the capacitor of the present embodiment.

In the present embodiment, the capacitor contact plug 7, the contact landing pad 8, the first storage electrode 13, the electrode landing pad 16, the second storage electrode 20, and the plate electrode 21 are formed with a conductive a metallic material or a metallic compound. As the above metallic material and metallic compound, a monolayer film or a laminated film of titanium nitride (TiN), tantalum nitride (TaN), tungsten nitride (WN), tungsten (W), ruthenium (Ru), iridium (Ir), platinum (Pt), or the like is used. The first storage electrode 13, the electrode landing pad 16 and the second storage electrode 20 may include the same conductive material.

On the other hand, for the capacitive insulating film 22, a monolayer film, a mixed film, or a laminated film of aluminum oxide (AlO), hafnium oxide (HfO), lanthanum oxide (LaO), titanium oxide (TiO), zirconium oxide (ZrO), tantalum oxide (TaO), niobium oxide (NbO), strontium oxide (SrO), or the like, may be applied.

Next there is described a method for manufacturing the semiconductor device of the present embodiment. The method for manufacturing the semiconductor device 31 of the present embodiment generally includes the following five steps. The first step is laminating a first insulating film on a capacitor contact plug, and forming a first storage electrode having a pillar shape by embedding the first storage electrode into the first insulating film. The second step is forming a recess immediately above the first storage electrode on a top surface of the first insulating film, the recess being larger than a top surface of the first storage electrode, and forming an electrode landing pad in the recess, the electrode landing pad having a landing surface for a second storage electrode, the landing surface being larger than a bottom surface of the second storage electrode. The third step is laminating a second insulating film so as to cover the first insulating film and the electrode landing pad, and forming the second storage electrode having a crown shape by embedding the second storage electrode into the second insulating film so that a bottom surface of the second storage electrode is placed on the landing surface. The fourth step is removing the first insulating film and the second insulating film. The fifth step is laminating a capacitive insulating film on an outer circumferential surface of the first storage electrode and on an outer circumferential surface of the electrode landing pad, and on an outer circumferential surface and an inner circumferential surface of the second storage electrode, and forming a plate electrode that covers the capacitive insulating film. Hereunder, each of the steps is described in detail.

(Step of Forming Contact Landing Pad)

A planar structure of the semiconductor device 31 of the present embodiment is briefly described. As shown in FIG. 2A, in the semiconductor substrate 1 there is formed a plurality of active regions 1a. Moreover, there is formed a plurality of gate electrodes 3 serving as word lines, so as to longitudinally pass through the plurality of active regions 1a. Above each of the active region 1a arranged between the gate electrodes 3, there are formed cell contact plugs 3a and 3b. The cell contact plug 3a is for a bit line, and the cell contact plug 3b is for a capacitor. Above this cell contact plug 3b there is formed the capacitor contact plug 7. The capacitor contact plug 7 is connected to the cell contact plug 3b. Above the capacitor contact plug 7 there is formed the contact landing pad 8. The contact landing pad 8 is connected to the capacitor contact plug 7. In a direction orthogonal to the gate electrode 3, there is formed a plurality of bit lines 5 (only one shown in the figure).

The step of forming the contact landing pad is described. As shown in FIG. 2A, in the step of forming the contact landing pad, first, the element isolation region 2 is formed in the semiconductor substrate 1 to form the active region 1a. Subsequently above this active region 1a there is formed the gate electrode 3 that serves as a word line, and then the cell contact plugs 3a, 3b are formed.

Next, after forming the first interlayer insulating film 4 on the entire top surface of the semiconductor substrate 1 and flattening the surface of the film 4 by means of a CMP (chemical mechanical polishing) method, the plurality of bit lines 5 are formed. Subsequently, after forming the second interlayer insulating film 6 so as to cover the bit lines 5, and flattening the surface by means of the CMP method, there is formed the capacitor contact plug 7 made of TiN and W.

Next, the contact landing pad 8 is formed so as to connect to the capacitor contact plug 7. This contact landing pad 8 is formed by means of patterning with use of the lithography method and dry etching method after sequentially depositing TiN and W on the entire surfaces of the second interlayer insulating film 6 and the capacitor contact plug 7. Subsequently, the etching stopper film 9 is formed above the contact landing pad 8. This etching stopper film 9 may be formed such that for example, a silicon nitride film is formed with an approximate thickness of 50 nm by means of CVD (chemical vapor deposition).

(Step of Forming First Storage Electrode)

Figure 3A:
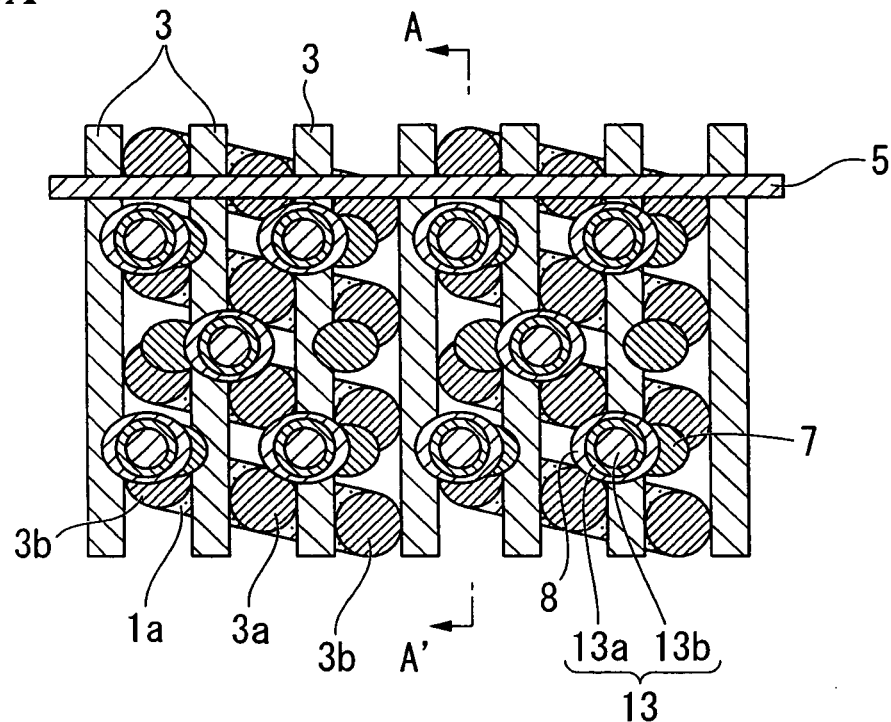
FIG. 3A is a plan view showing a process involved in the method for manufacturing the semiconductor device of the first embodiment.
Figure 3B:
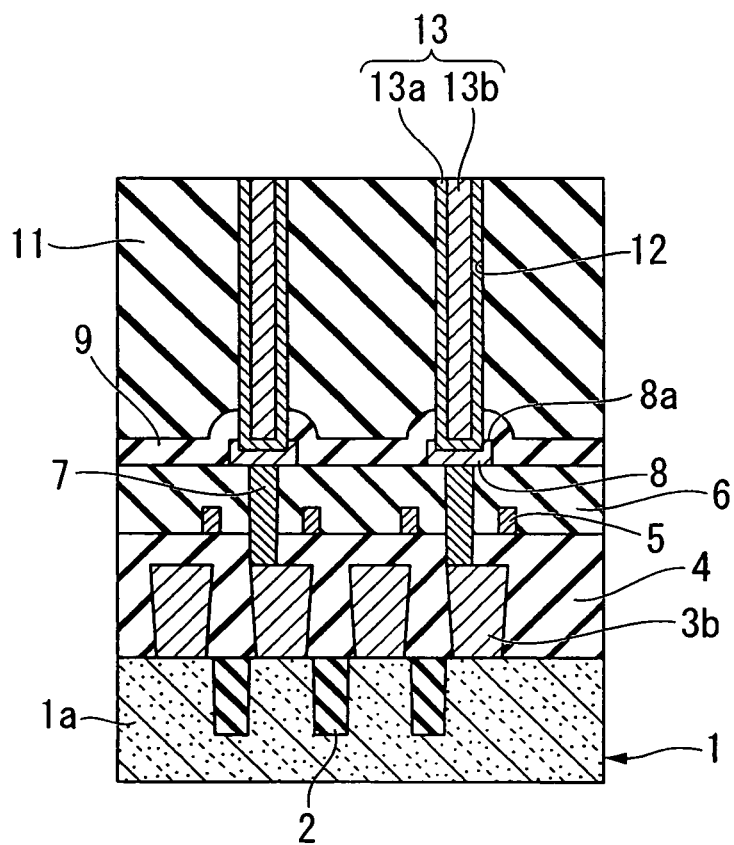
FIG. 3B is a sectional view taken along the line A-A' shown in FIG. 3A.

Next there is described the step of laminating the first insulating film on the capacitor contact plug, and forming the first storage electrode having a pillar shape by embedding the first storage electrode into the first insulating film, that is, the step of forming the first storage electrode. As shown in FIG. 3B, in the step of forming the first storage electrode, for example, a silicon oxide film may be formed by means of the plasma CVD method with an approximate thickness of 1 µm so as to form a first insulating film 11.

Next, by means of the lithography method and dry etching method there is formed a cylinder hole 12 having an approximate diameter of 80 nm for example. This cylinder hole 12 is formed by continuously etching the first insulating film 11 and the etching stopper film 9 with use of gas plasma having fluorine (F) as its primary component.

Next, a part of the landing surface 8a for the first storage electrode 13, of the exposed contact landing pad 8, is overetched to thereby form a concave section. The over-etching of this landing surface 8a is performed until the film thickness of the contact landing pad 8 has become approximately half, for example. In a case where the contact landing pad 8 is formed with tungsten (W), the primary component of the gas plasma may be replaced with chlorine (Cl) to perform the etching. In the case of the primary component of the gas plasma being replaced with chlorine, it is possible to increase the etching selection ratio with respect to the silicon oxide film. Therefore, a reduction in the film thickness of the first insulating film 11 can be suppressed while performing etching on the tungsten at a high level of precision.

Next, the inner circumferential surface of the cylinder hole 12 and the concave section of the landing surface 8a are cleaned. Then, a TiN layer 13a is formed, for example, with a thickness of 15 nm on the inner circumferential surface of the cylinder hole 12 and the concave section of the landing surface 8a, and a W layer 13b is continuously formed, for example, with a thickness of 140 nm in the inside of the inner circumferential surface of the cylinder hole 12 and the concave section of the landing surface 8a. As a result, the cylinder hole 12 and the concave section of the landing surface 8a are filled. Subsequently the W layer 13b and the TiN layer 13a formed on top of the first insulating film 11 are removed by means of the CMP method. As a result, within the cylinder hole 12 and the concave section of the landing surface 8a, there is formed the pillar-shaped first storage electrode 13 formed with the TiN layer 13a and the W layer 13b. FIG. 3A is a plan view showing the process stage where the first storage electrode 13 has been formed. As shown in FIG. 3B, the bottom surface of the cylinder hole 12 is formed continuous with the concave section of the landing surface 8a of the contact landing pad 8, and hence the bottom surface of the first storage electrode 13 passes through the etching stopper film 9 and is inserted into the concave section formed on a part of the landing surface 8a.

(Step of Forming Electrode Landing Pad)

Figure 4:
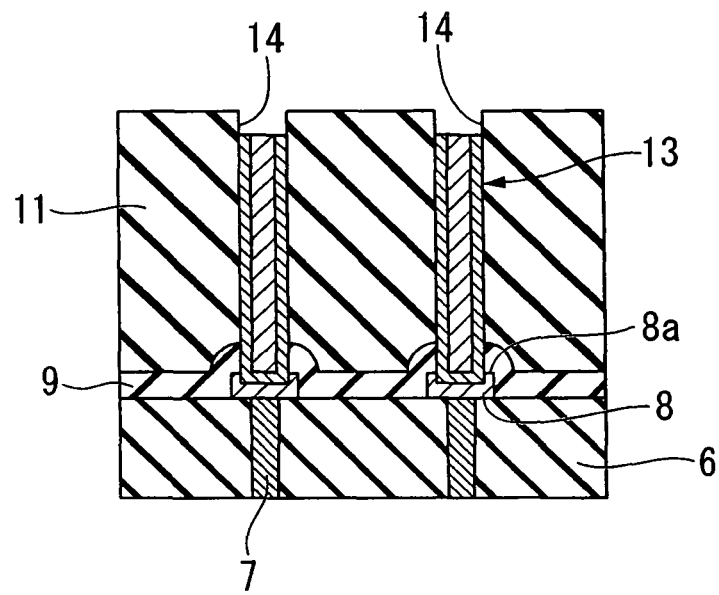
FIG. 4 is a process sectional view showing a process involved in the method for manufacturing the semiconductor device of the first embodiment.

Next there is described the step of forming a recess immediately above the first storage electrode on the top surface of the first insulating film, the recess being larger than the top surface of the first storage electrode, and forming the electrode landing pad in the recess, the electrode landing pad having the landing surface for the second storage electrode, the landing surface being larger than the bottom surface of the second storage electrode. That is, there is described the step of forming the electrode landing pad. As shown in FIG. 4, in the step of forming the electrode landing pad, a recess (concave section) 14 is formed on the first storage electrode 13. This recess 14 is formed such that after forming the first storage electrode 13, the top surface of the first storage electrode 13 is dry etched-back with use of gas plasma including sulfur hexafluoride (SF6) gas, for example, to an approximate depth of 60 nm. As shown in FIG. 4, the vertical section of the recess 14 has a rectangular shape.

Figure 5:
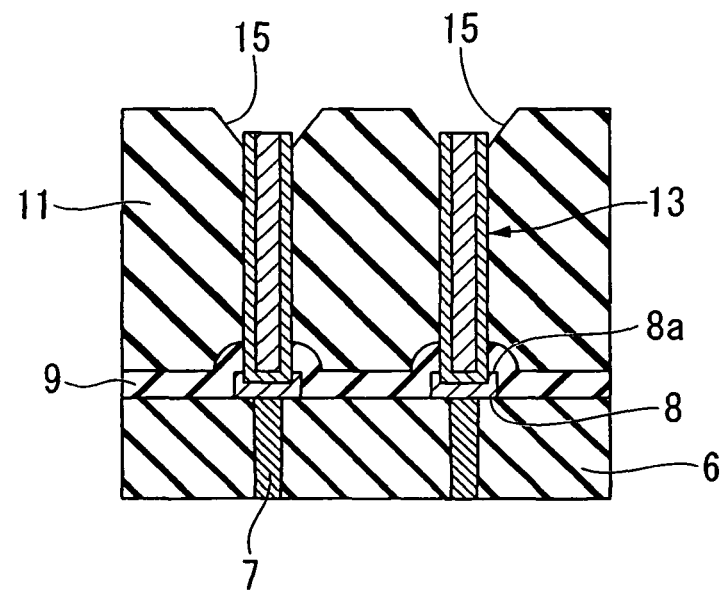
FIG. 5 is a process sectional view showing a process involved in the method for manufacturing the semiconductor device of the first embodiment.

Next, as shown in FIG. 5, sputter etching is performed on the recess 14, the vertical section of which has a rectangular shape, to approximately 30 nm from the top surface of the first storage insulating film 11 for example. As a result, as shown in FIG. 5, there can be formed a recess 15 having an inner circumferential surface, the vertical section of which has a reverse tapered shape. The diameter of the recess 15 is formed so as to increase from a bottom end of the recess 15 toward a top end of the recess 15. The top end of the recess 15 is larger than the top surface of the first storage electrode 13. As commonly known, in sputter etching using argon (Ar), sputtering efficiency is highest on a surface having a 45° angle. In the present embodiment, this characteristic is utilized to thereby form the reverse tapered-shaped inner circumferential surface.

Figure 6:
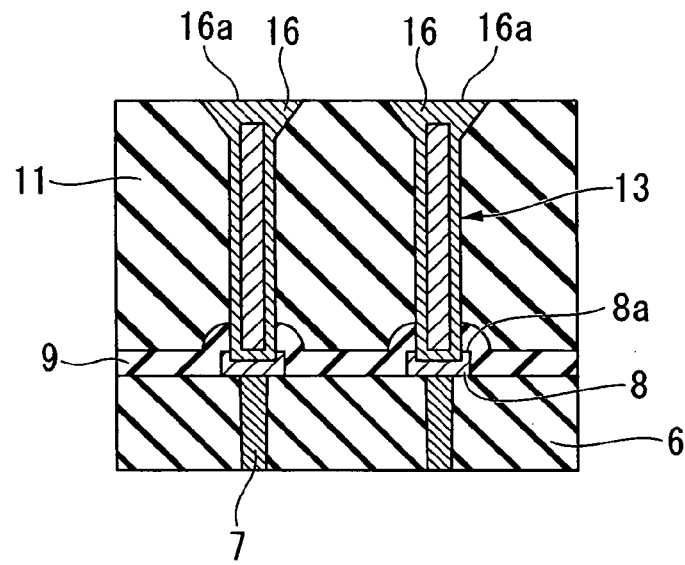
FIG. 6 is a process sectional view a process involved in showing the method for manufacturing the semiconductor device of the first embodiment.

Next, as shown in FIG. 6, the electrode landing pad 16 is formed in the recess 15. This electrode landing pad 16 is formed such that after depositing a TiN film on the entire surface of the recess 15, for example, with a thickness of 60 nm, the surplus TiN film formed on the first insulating film 11 is removed by means of the CMP method. By so doing, the electrode landing pad 16 having a height of 30 nm for example, is formed.

(Step of Forming Second Storage Electrode)

Next there is described the step of laminating a second insulating film so as to cover the first insulating film and the electrode landing pad, and forming the second storage electrode having a crown shape by embedding the second storage electrode into the second insulating film so that the bottom surface of the second storage electrode is placed on the landing surface. That is, there is described the step of forming the second storage electrode.

Figure 7:
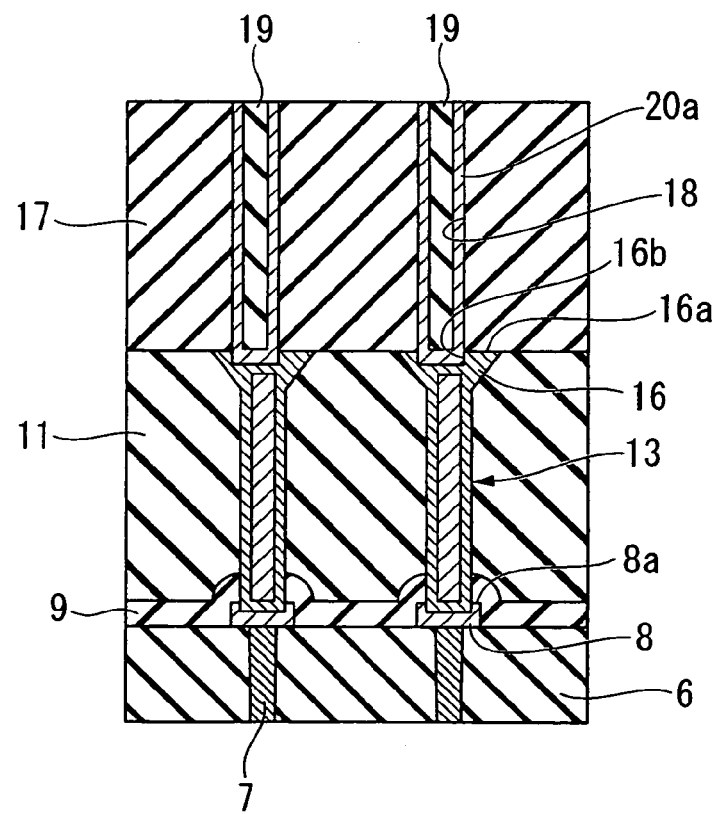
FIG. 7 is a process sectional view showing a process involved in the method for manufacturing the semiconductor device of the first embodiment.

As shown in FIG. 7, in the step of forming the second storage electrode, first, a second insulating film 17 is formed with a thickness of 1 µm for example. Next, by means of the lithography method and dry etching method, a cylinder hole 18 is formed in the second insulating film 17. This cylinder hole 18 is formed by etching the second insulating film 17 with use of gas plasma including fluorine (F) as its primary component.

Next, a part of a landing surface 16a of the electrode landing pad 16 exposed to the bottom surface of the cylinder hole 18, is over-etched, for example, by an approximate depth of 30 nm, to thereby form the concave section 16b. In a case where the electrode landing pad 16 is a TiN film, it is also possible to perform over-etching by switching to gas plasma that includes chlorine as its primary component.

Next, a TiN film 20a is deposited with a thickness of 15 nm for example, entirely on the inner circumferential surface of the cylinder hole 18 and the concave section 16b. Then, the inside of the cylinder hole 18 and the concave section 16b is filled, for example, with a silicon oxide film 19. The TiN film 20a formed on the second insulating film 17 is removed by means of the CMP method. The second storage electrode 20 is formed in a state where the bottom surface of the second storage electrode 20 is inserted into the concave section 16b formed on a part of the landing surface 16a of the electrode landing pad 16. As a result the area of contact between the second storage electrode 20 and the electrode landing pad 16 is ensured, and the mechanical strength is increased. Therefore, it is possible to suppress collapse of the second storage electrode 20.

(Step of Removing Insulating Film)

Figure 8:
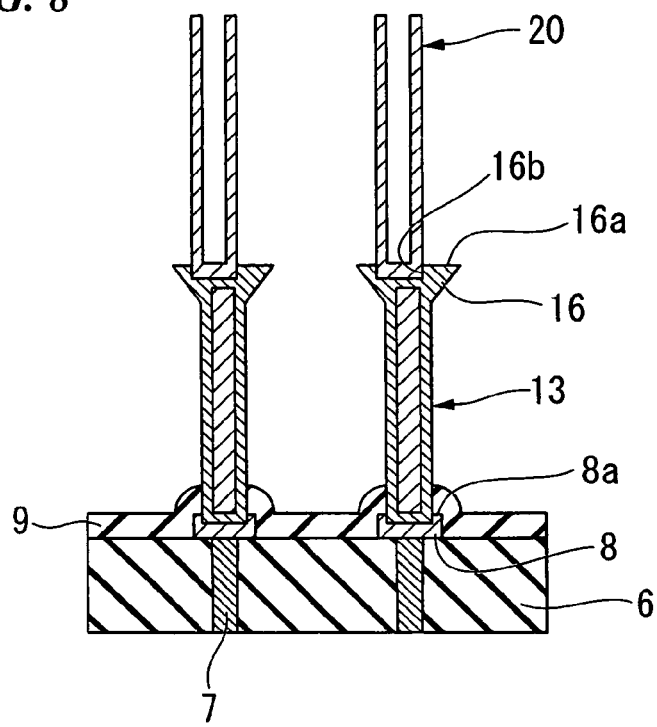
FIG. 8 is a process sectional view showing a process involved in the method for manufacturing the semiconductor device of the first embodiment.

Next there is described the step of removing the first insulating film and the second insulating film, that is, the step of removing the insulating film. As shown in FIG. 8, in the step of removing the insulating film, with use of highly concentrated (50%) hydrofluoric acid, the second insulating film 17, the silicon oxide film 19, and the first insulating film 11 are removed by means of wet etching.

(Step of Forming Capacitive Insulating Film and Plate Electrode)

Figure 9:
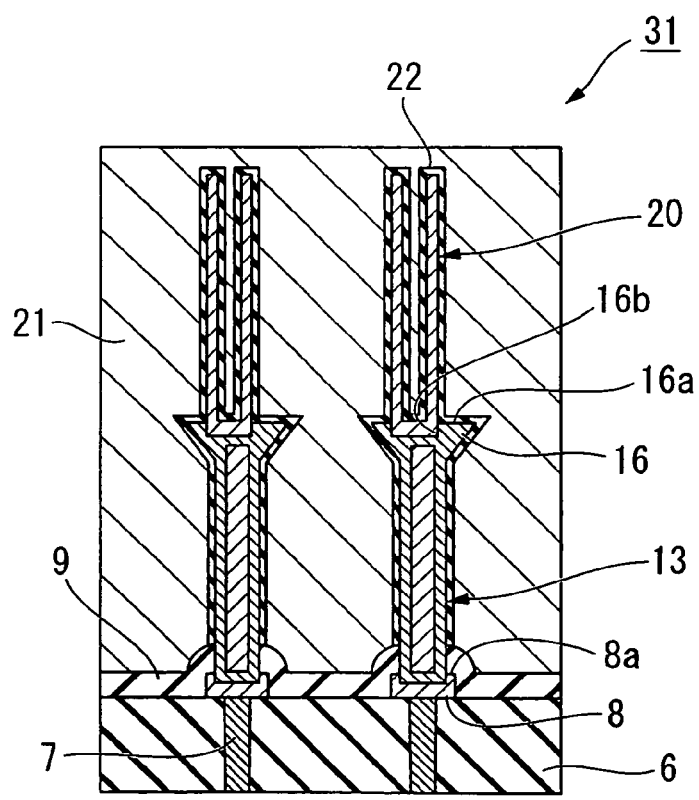
FIG. 9 is a process sectional view showing a process involved in the method for manufacturing the semiconductor device of the first embodiment.

Finally there is described the step of laminating the capacitive insulating film on the outer circumferential surface of the first storage electrode and on the outer circumferential surface of the electrode landing pad, and on the outer circumferential surface and the inner circumferential surface of the second storage electrode, and forming the plate electrode that covers the capacitive insulating film. That is, there is described the step of forming the capacitive insulating film and the plate electrode. In the step of forming the capacitive insulating film and the plate electrode, a common capacitor insulating film 22 for the first storage electrode and the second storage electrode is formed so as to entirely cover the outer circumferential surface of the first storage electrode 13 and the electrode landing pad 16, and the outer circumferential surface and the inner circumferential surface of the second storage electrode 20. Next, as shown in FIG. 9, the plate electrode 21 made with the TiN film and W film is formed so as to coat the capacitive insulating film 22. The semiconductor device 31 shown in FIG. 1 is formed through the steps described above.

As described above, according to the semiconductor device 31 of the present embodiment, between the pillar-shaped first storage electrode 13 and the crown shaped second storage electrode 20, there is provided the electrode landing pad 16. The electrode landing pad 16 has the landing surface 16a for the second storage electrode that is larger than the bottom surface of the second storage electrode 20. Consequently, the overlapping margin of the first storage electrode 13 and the second storage electrode 20 is expanded. As a result, the overlapping displacement of the pillar-shaped first storage electrode 13 and the crown shaped second storage electrode 20 is reduced, and a reduction in the area of contact between the bottom surface of the crown shaped second storage electrode 20 and the landing surface 16a of the electrode landing pad 16, is suppressed. Therefore it is possible to ensure capacitor capacity, while suppressing collapse of the second storage electrode 20 associated with the reduced mechanical strength of the second storage electrode 20.

Moreover, according to the semiconductor device 31 of the present embodiment, the second storage electrode 20 is inserted in the concave section 16b provided in a part of the landing surface 16a of the electrode landing pad 16. Therefore it is possible to improve the mechanical strength. As a result it is possible to effectively suppress collapse of the second storage electrode 20. Furthermore, between the first storage electrode 13 and the second storage electrode 20 there is provided the electrode landing pad 16, and the outer circumferential surface of the electrode landing pad 16 has a reverse tapered surface. Consequently, the entire surface area of the storage electrode is increased, and hence it is possible to increase the capacity of the capacitor. Furthermore, the bottom surface of the first storage electrode 13 passes through the etching stopper film 9, and is inserted in the concave section provided in a part of the landing surface 8a of the contact landing pad 8. As a result the mechanical strength is improved, and collapse of the first storage electrode 13 can be prevented. In this way, collapse and distortion of the first and second storage electrodes 13 and 20 are prevented, and application of stress to the capacitive insulating film 22 can be avoided. Therefore it is possible to suppress an increase in leakage current of the capacitive insulating film 22.

According to the method for manufacturing the semiconductor device 31 of the present embodiment, the electrode landing pad 16 is formed while self-aligning with respect to the first storage electrode 13. Therefore it is possible to suppress positional displacement between the first storage electrode 13 and the electrode landing pad 16. Moreover, the first insulating film 11 for forming the first storage electrode 13 can be used as it is. Consequently there is no need for adding a new lithography process for forming the electrode landing pad 16. Furthermore, the top surface of the first insulating film 11, that is, the portion immediately above the first storage electrode 13, can be formed by means of sputter etching. Consequently it is possible to comparatively easily form a pattern (reverse pattern) of the electrode landing pad 16 in a reverse tapered shape having the large landing surface 16a.

Moreover, according to the method for manufacturing the semiconductor device 31 of the present embodiment, the concave section 16b formed on a part of the landing surface 16a is formed continuous with the cylinder hole 18 for forming the second storage electrode 20. Therefore, positional displacement between the second storage electrode 20 and the concave section 16b is suppressed, and the bottom surface of the second storage electrode 20 can be easily inserted into the concave section 16b.

Second Embodiment

Next there is described a second embodiment of the present invention.

Figure 10:
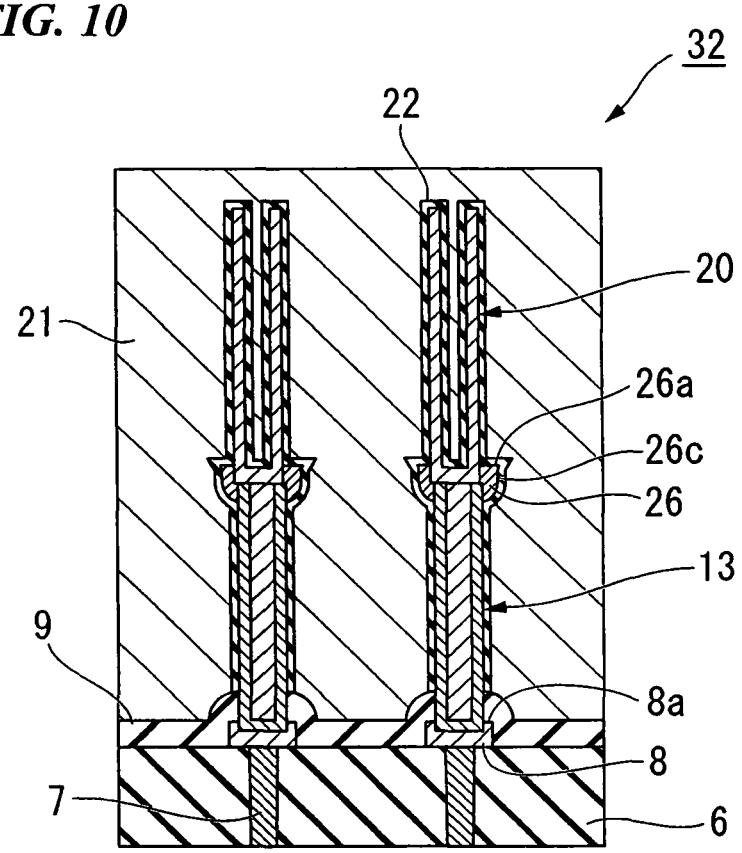
FIG. 10 is a schematic sectional view showing a semiconductor device according to a second embodiment of the present invention.
Figure 11:
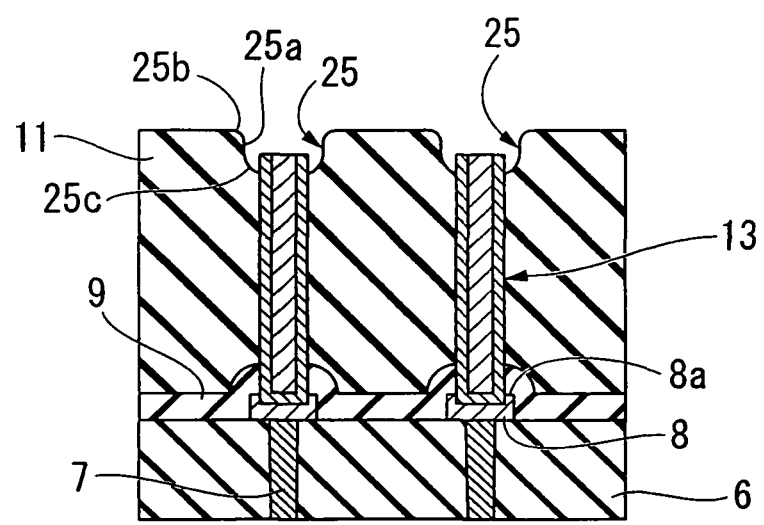
FIG. 11 is a process sectional view showing a process involved in a method for manufacturing the semiconductor device of the second embodiment.
Figure 12:
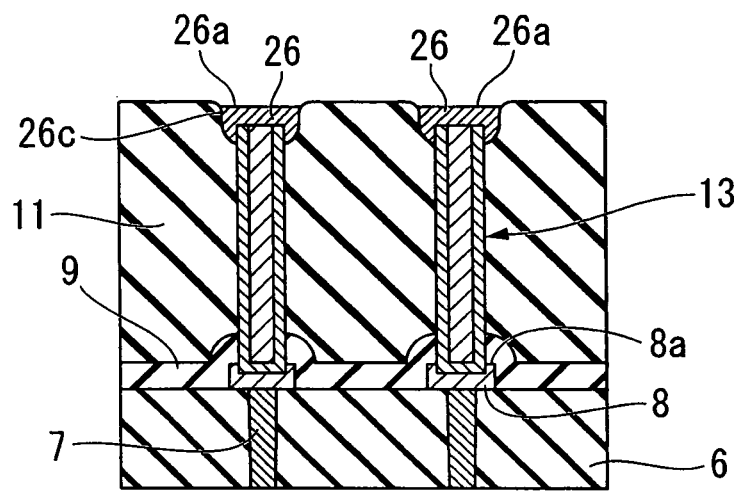
FIG. 12 is a process sectional view showing a process involved in the method for manufacturing the semiconductor device of the second embodiment.
Figure 13:
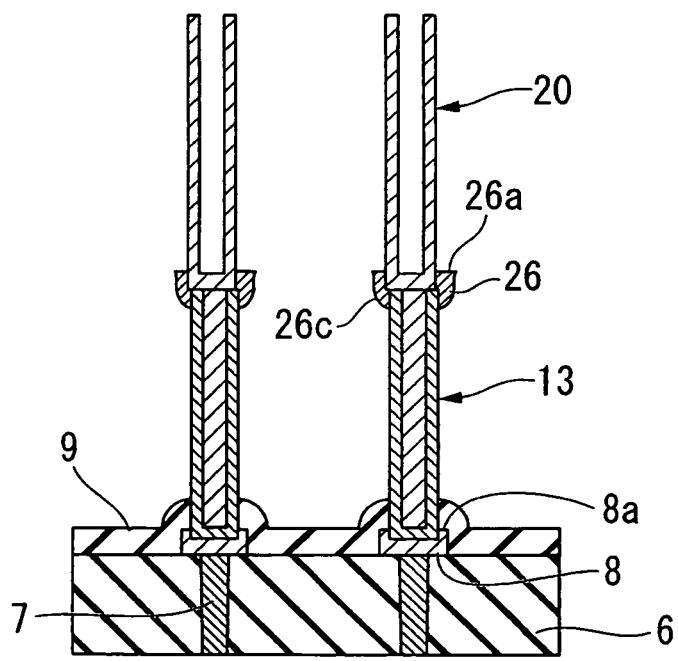
FIG. 13 is a process sectional view showing a process involved in the method for manufacturing the semiconductor device of the second embodiment.

FIG. 10 is a schematic sectional view showing a semiconductor device according to a second embodiment of the present invention. Moreover, FIG. 11 to FIG. 13 are process sectional views showing a method for manufacturing the semiconductor device of the present embodiment.

First, a configuration of the semiconductor device of the present embodiment is described.

As shown in FIG. 10, in a semiconductor device 32 of the present embodiment, the configuration of an electrode landing pad 26 differs from the configuration of the electrode landing pad 16 of the first embodiment described above. Other configuration is the same as for the first embodiment. Therefore, for the semiconductor device 32 of the present embodiment, component parts the same as in the semiconductor device 31 of the first embodiment are denoted by the same reference symbols, and descriptions thereof are omitted.

As shown in FIG. 10, the electrode landing pad 26 has an outer circumferential surface 26c. A part of the outer circumferential surface 26c is a substantially perpendicular cylindrical surface. Moreover, the top end section and the bottom end section of the outer circumferential surface 26c are a round arc shape. Furthermore, the bottom end section of the outer circumferential surface 26c is provided in a position at a depth of 30 nm for example, from a landing surface 26a of the electrode landing pad 26. Consequently, compared to the electrode landing pad 16 of the above first embodiment, the electrode landing pad 26 of the present embodiment has a shape close to a vertically long cylinder (approximate cylindrical shape), and the depth from the above landing surface 26a to the bottom end section of the outer circumferential surface 26c is made substantially uniform.

Next there is described a method for manufacturing the semiconductor device 32 of the second embodiment. For the method for manufacturing the semiconductor device 32 of the present embodiment, steps the same as those in the method for manufacturing the semiconductor device 31 of the first embodiment are denoted by the same reference symbols, and descriptions thereof are omitted.

(Step of Forming Second Landing Pad)

In the step of forming the electrode landing pad of the present embodiment, first, in a manner similar to that shown in FIG. 4, a recess (concave section) 14 is formed on the first storage electrode 13. Subsequently, as shown in FIG. 11, the first insulating film 11 is wet etched, for example to a depth of 30 nm, with dilute hydrofluoric acid. Unlike sputter etching, in wet etching the etching speed does not involve directionality. Therefore the etching progresses at the same speed in all portions. As a result, as shown in FIG. 11, the recess 14 is shaped into the recess 25, a part of an inner circumferential surface 25a of which is formed in a substantially perpendicular cylindrical surface. Moreover, due to the liquid flow in wet etching, a top end section 25b and a bottom end section 25c of the inner circumferential surface 25a are shaped in a round shape. By means of wet etching, by adjusting process time, it is possible to perform control so that the bottom end section 25c is positioned, for example, approximately 30 nm below the top surface of the first insulating film 11.

Next, as shown in FIG. 12, the electrode landing pad 26 is formed in the shaped recess 25 with use of the method the same as in the first embodiment. Furthermore, as shown in FIG. 13, the second storage electrode 20 is formed. Subsequently, the capacitive insulating film 22 and the plate electrode 21 are formed in a manner similar to that in the first embodiment, so that it is possible to form the semiconductor device 32 shown in FIG. 10.

As described above, according to the semiconductor device 32 of the present embodiment, the electrode landing pad 26 is formed in a substantially cylindrical shape. Therefore the surface area of the storage electrode is increased, and the capacitor capacity can be ensured. Moreover, the depth from the landing surface 26a is made substantially uniform. Therefore it is possible to deeply embed the bottom surface of the second storage electrode 20 into the electrode landing pad 26. As a result, the mechanical strength of the second storage electrode 20 can be improved, and hence it is possible to further effectively prevent collapse of the second storage electrode 20.

Moreover, according to the method for manufacturing the semiconductor device 32 of the present embodiment, since the recess 25 is shaped by means of wet etching, it is possible to form the recess 25 in a substantially cylindrical shape, compared to the case of sputter etching. As a result, it is possible to make the depth of the recess 25 uniform. Moreover, in sputter etching, even if the depth of the recess 14 to be formed first is made deep, the depth that can be formed by means of sputter etching is constrained by the sidewall inclination angle 45°. That is to say, in sputter etching, if the recess is to be formed deep, the recess also expands in the lateral direction. Consequently, adjacent capacitors are short-circuited, and the formable depth of the recess may be limited in some cases. However, in wet etching in the present embodiment, since isotropic etching is used, there is no such limitation, and the recess 25 can be shaped deep according to the depth of the recess 14 to be formed first. As a result it is possible to easily achieve miniaturization.

Third Embodiment

Next there is described a third embodiment of the present invention.

Figure 14:
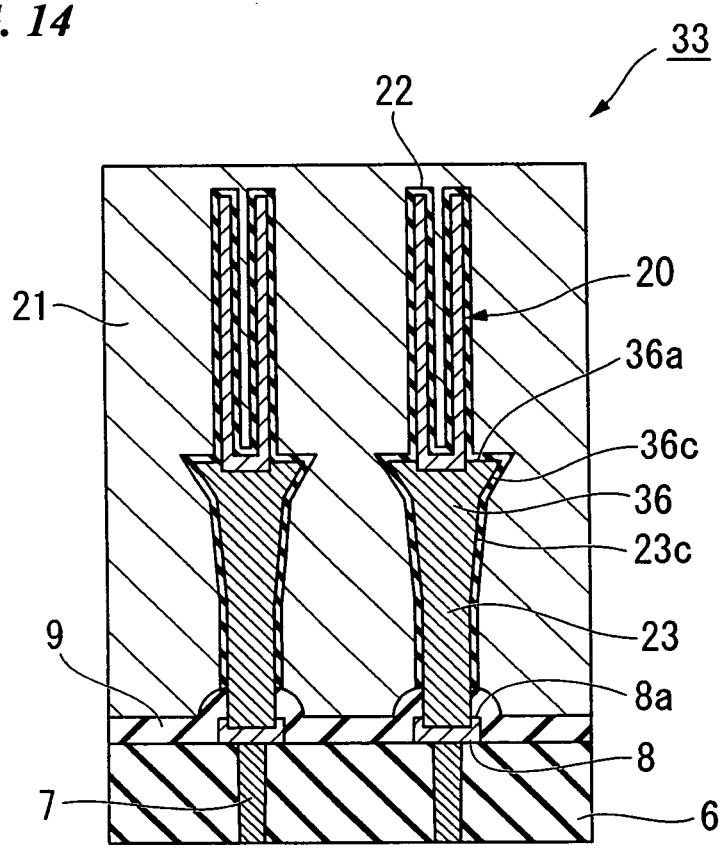
FIG. 14 is a schematic sectional view showing a semiconductor device according to a third embodiment of the present invention.

FIG. 14 is a schematic sectional view showing a semiconductor device according to a third embodiment of the present invention. Moreover, FIG. 15 to FIG. 18 are process sectional views showing a method for manufacturing the semiconductor device of the present embodiment.

First, a configuration of the semiconductor device of the present embodiment is described.

As shown in FIG. 14, in a semiconductor device 33 of the present embodiment, the configuration of a first storage electrode 23 differs from the configuration of the first storage electrode 13 of the first embodiment described above. Other configuration is the same as for the first embodiment. Consequently for the semiconductor device 33 of the present embodiment, component parts the same as in the semiconductor device 31 of the first embodiment are denoted by the same reference symbols, and descriptions thereof are omitted.

As shown in FIG. 14, a part of the outer circumferential surface of the first storage electrode 23 is a reverse tapered surface 23c. Moreover, the reverse tapered surface 23c, compared to a reverse tapered surface 36c that forms the outer circumferential surface of an electrode landing pad 36, is gradually inclined with respect to the vertical direction. That is, the part of the outer diameter of the first storage electrode 23 increases less rapidly than the outer diameter of the electrode landing pad 36. This first storage electrode 23 is formed solely with ruthenium (Ru), and ruthenium (Ru) is also used for the material of the electrode landing pad 36. Consequently, the first storage electrode 23 and the electrode landing pad 36 appear to be integrated.

Next there is described a method for manufacturing the semiconductor device 33 of the third embodiment. For the method for manufacturing the semiconductor device 33 of the present embodiment, steps the same as those in the method for manufacturing the semiconductors devices 31 and 32 of the first and second embodiments are denoted by the same reference symbols, and descriptions thereof are omitted.

(Step of Forming First Storage Electrode and Electrode Landing Pad)

Figure 15:
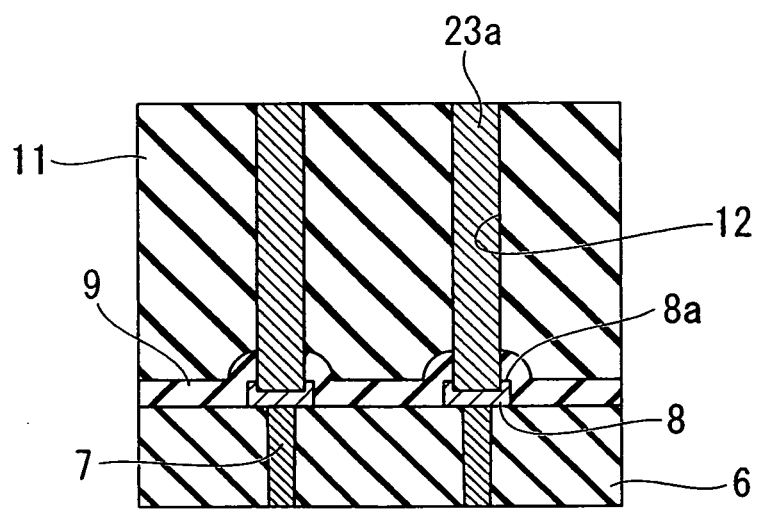
FIG. 15 is a process sectional view showing a process involved in a method for manufacturing the semiconductor device of the third embodiment.

In a step of forming the first storage electrode of the present embodiment, first, in a way similar to that of the first embodiment shown in FIG. 3B, for the first insulating film 11, a silicon oxide film is formed with an approximate thickness of 1 μm for example, by means of the plasma CVD method. Next, by means of the lithography method and dry etching method, there is formed a cylinder hole 12 having an approximate diameter of 80 nm for example. Next, as shown in FIG. 15, a Ru layer 23a is formed with an approximate thickness of 70 nm for example, to fill in the cylinder hole 12. Subsequently, the Ru layer 23a formed on the first insulating film 11 is removed by means of the CMP method.

Figure 16:
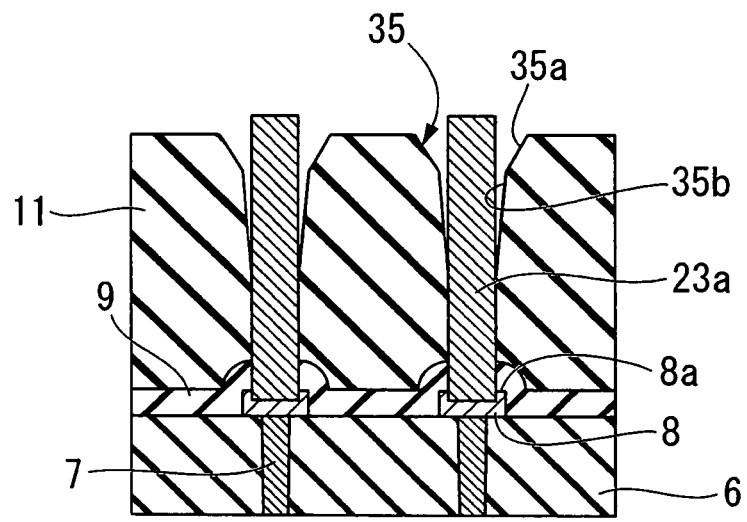
FIG. 16 is a process sectional view showing a process involved in the method for manufacturing the semiconductor device of the third embodiment.

Next, as shown in FIG. 16, a part of the first insulating film 11 in contact with the first storage electrode 23 is detched to thereby form a clearance 35. For example, with use of dilute hydrofluoric acid, the first insulating film 11 formed with a silicon oxide film is wet etched by approximately 40 nm. Because adhesivity is low between the Ru layer 23a formed with ruthenium and the first insulating film 11 formed with a silicon oxide film, the etchant (dilute hydrofluoric acid) penetrates into the interfacial surface between the Ru layer 23a and the first insulating film 11. As a result the silicon oxide film in contact with the Ru layer 23a is etched more quickly than the top surface of the first insulating film 11, and the clearance 35 is formed on the interfacial surface. The inner circumferential surface of this clearance 35 is such that, as shown in FIG. 16, the diameter thereof gradually reduces from the top surface of the first insulating film along the Ru layer 23a, and a reverse tapered surface 35a and a reverse tapered surface 35b that inclines more gradually than this reverse tapered surface 35a, are continuously formed.

Figure 17:
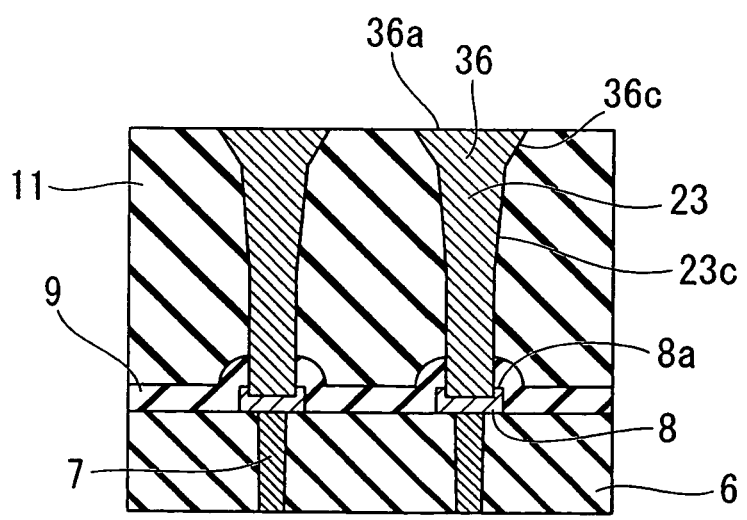
FIG. 17 is a process sectional view showing a process involved in the method for manufacturing the semiconductor device of the third embodiment.

Next, as shown in FIG. 17, inside the clearance 35 there is filled ruthenium (Ru), which is the formation material for the electrode landing pad 36, so as to give a thickness of 70 nm for example. Next, flattening processing is performed by means of CMP, so that it is possible to simultaneously form the electrode landing pad 36, the outer circumferential surface of which is the reverse tapered surface 36c, and the first storage electrode 23, a part of the outer circumferential surface of which is the reverse tapered surface 23c that gradually inclines. The height of the electrode landing pad 36 can be formed to approximately 30 nm for example.

Figure 18:
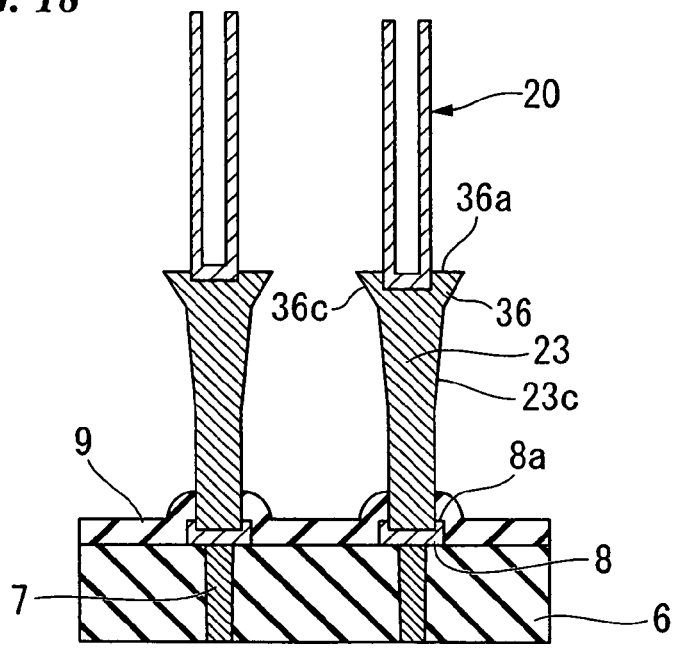
FIG. 18 is a process sectional view showing a process involved in the method for manufacturing the semiconductor device of the third embodiment.

Next, as shown in FIG. 18, in a manner similar to that of the above first embodiment, the second storage electrode 20 is formed on the landing surface 36a of the electrode landing pad 36. Subsequently, the capacitive insulating film 22 and the plate electrode 21 are formed in a manner similar to that in the first embodiment, to thereby form the semiconductor device 33 shown in FIG. 14.

As described above, according to the semiconductor device 33 of the present embodiment, a part of the outer circumferential surface of the first storage electrode 23 is the reverse tapered surface 23c. Therefore, it is possible to increase the surface area of the entire storage electrode. Consequently the capacitor capacity can be improved.

Moreover, according to the method for manufacturing the semiconductor device 33 of the present embodiment, unlike the first and second embodiments, there is no need for performing dry etch-back processing of the first storage electrode 13. As a result it is possible to easily form on the first storage electrode 23, the electrode landing pad 36 having the landing surface 36a that is larger than the bottom surface of the second storage electrode 20.

Figure 19:
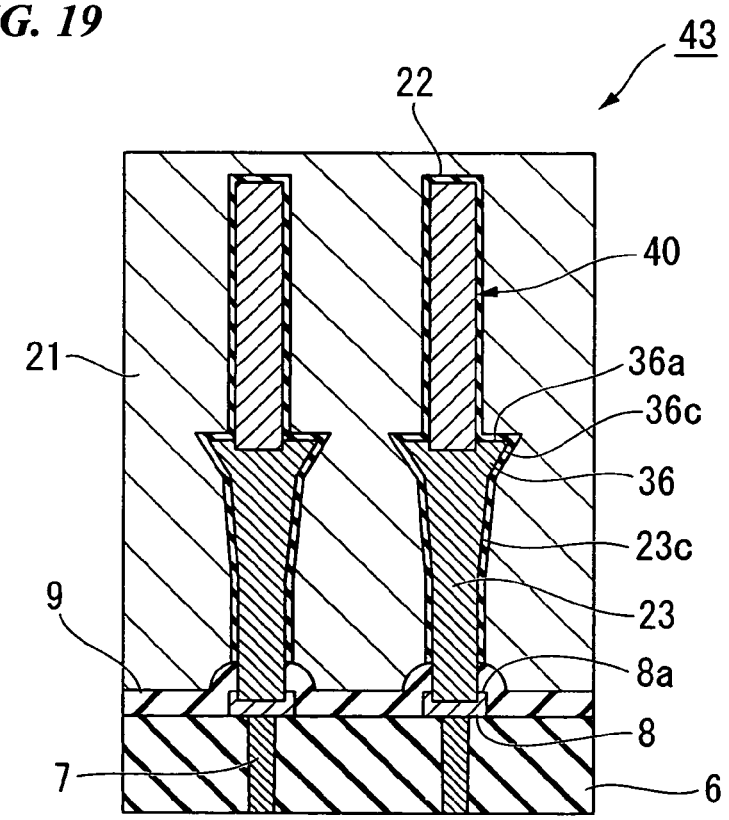
FIG. 19 is a schematic sectional view showing a modified example of the semiconductor device according to the third embodiment of the present invention.

The semiconductor device 33 of the present embodiment includes the crown shaped second storage electrode 20 as shown in FIG. 14, but it is not limited thereto. For example, as shown in FIG. 19, A semiconductor device 43 may include a pillar-shaped second storage electrode 40 instead of the crown shaped second storage electrode 20. This pillar-shaped second storage electrode 40 can be formed in a way similar to that of the above manufacturing method. Consequently by forming the second storage electrode in a pillar shape, it is possible to form the bottom surface of the second storage electrode smaller than that formed in a crown shape. That is to say, according to this semiconductor device 43, it is possible to achieve further miniaturization compared to the semiconductor device 33 provided with the crown shaped second storage electrode.

WORKING EXAMPLE

Hereunder, an effect of a semiconductor device according to a working example of the present invention is described in detail.

Figure 20:
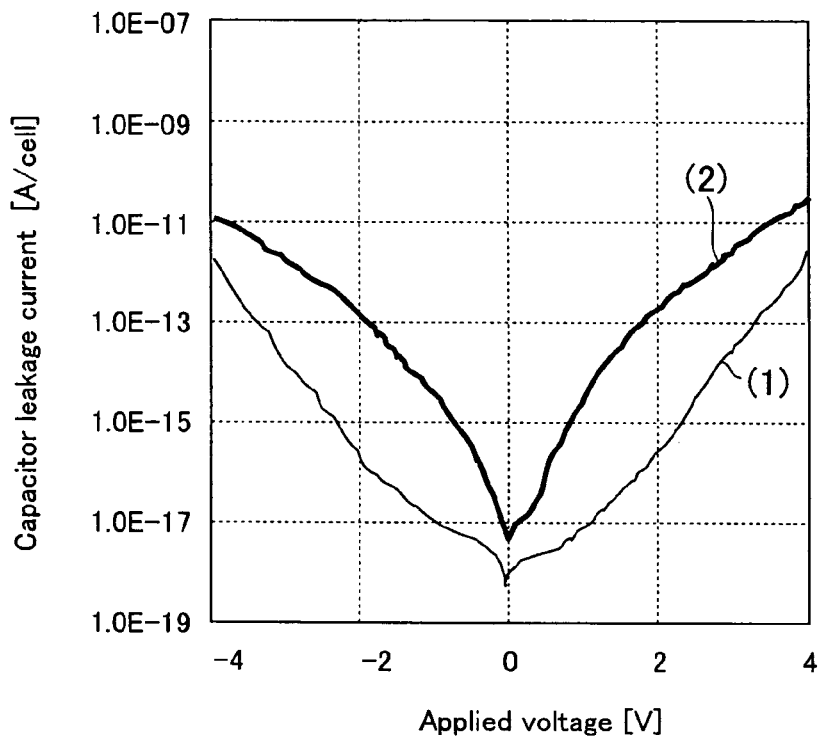
FIG. 20 is a graph showing leakage current characteristics of a semiconductor device of a working example of the present invention and of a semiconductor device of a comparative example.
Figure 21:
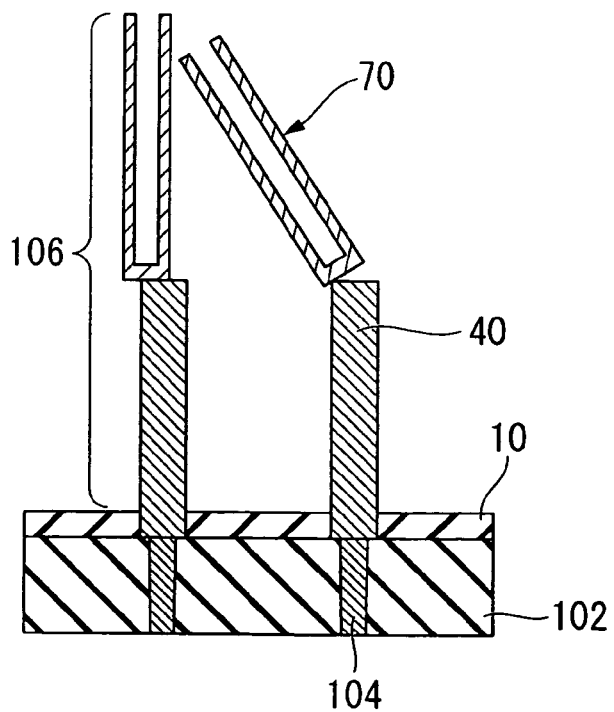
FIG. 21 is a schematic sectional view for describing problems of a semiconductor device of a conventional art having a two-stage capacitor.

FIG. 20 is a graph showing a comparison between leakage current characteristics of a semiconductor device of a working example according to the present invention, and of a semiconductor device of a comparative example. For this characteristic evaluation, there was used a TEG (test element group) in which two-stage capacitors were formed in a 512M cell parallel array on a semiconductor substrate, with a highly concentrated diffusion layer formed on the surface of the substrate. A TEG having the configuration of the semiconductor device 31 of the first embodiment shown in FIG. 1 was taken as the working example. On the other hand, a TEG in which the configuration of the contact landing pad 8 and the electrode landing pad 16 were omitted from the configuration of the semiconductor device 31 shown in FIG. 1 was taken as the comparative example. For the capacitive insulating films of the working example and the comparative example, a laminated layer of aluminum oxide and hafnium oxide was used. TiN was used for the contact landing pad 8, the pillar-shaped first storage electrode 13, the electrode landing pad 16, the crown shaped second storage electrode 20, and the plate electrode 21.

In FIG. 20, profile (1) shows the leakage current characteristic of the semiconductor device of the working example. In FIG. 20, profile (2) shows the leakage current characteristic of the semiconductor device of the comparative example. The vertical axis of FIG. 20 represents leakage current value per 1 cell, and the horizontal axis represents applied voltage to the plate electrode in a case where the semiconductor substrate carries ground potential. The leakage current tolerance value required in a DRAM corresponding to a 512M cell is not more than $1 \times 10^{-17}$ A/cell at $\pm 1$V.

In the semiconductor device of the working example, as shown in profile (1) of FIG. 20, it was confirmed that the above leakage current tolerance value was satisfied. On the other hand, in the comparative example, as shown in profile (2) of FIG. 20, it was confirmed that the above leakage current tolerance value was not satisfied. As shown in FIG. 20, for an applied voltage of 1V and −1V, leakage current in the comparative example was greater than that in the working example by approximately two digits.

It is apparent that the present invention is not limited to the above embodiments, but may be modified and changed without departing from the scope and spirit of the invention.

What is claimed is:
1. A semiconductor device comprising:
a transistor formed in a semiconductor substrate;
a conductive material having a landing portion and a connecting portion, the connecting portion connecting electrically to the transistor, the landing portion including a landing surface and a side surface, the landing surface having a concave section that is smaller in area than the landing surface, and the side surface extending downwardly from the landing surface;
an etching stopper film formed in contact with at least a part of the side surface of the landing portion to surround the landing portion, the etching stopper film having a window that is opened to expose at least a part of the landing surface;
a lower electrode being disposed on the conductive material and covering an inner part of the window of the etching stopper film such that the etching stopper film contacts a side surface of the lower electrode, the lower electrode being in contact with the concave section of the landing surface, and the lower electrode further comprising a cup shape that includes an inner surface and an outer surface;

a capacitive insulating film formed on the side surface of the lower electrode, such that the etching stopper film is formed between the capacitive insulating film and the side surface of the landing portion of the conductive material; and a plate electrode formed on the etching stopper film and the capacitive insulating film, such that the capacitive insulating film is formed between the side surface of the lower electrode and the plate electrode.

2. The semiconductor device according to claim 1, wherein a height of the landing portion at the side surface is greater than a height of the landing portion at the concave section.

3. The semiconductor device according to the claim 1, wherein a width of the landing portion is greater than a width of the lower electrode.

4. The semiconductor device according to claim 1, wherein at least a part of the conductive material contains a metal material.

5. The semiconductor device according to the claim 1, wherein the conductive material at the concave section of the landing surface and at the side surface, comprises the same material.

6. The semiconductor device according to the claim 1, wherein the conductive material at the concave section of the landing surface and at the side surface, comprises a metallic material.

7. The semiconductor device according to the claim 1, wherein a thickness of the etching stopper film at a side surface of the lower electrode is greater than a depth of the concave section of the landing surface.

8. The semiconductor device according to the claim 1, wherein the capacitive insulating film is separated from the conductive material by the etching stopper film.

9. The semiconductor device according to the claim 1, wherein the conductive material comprises a cup shape, and a thickness of the conductive material at the concave section of the landing surface is approximately one-half of a thickness of the conductive material at the side surface.

10. A semiconductor device comprising:
a transistor formed in a semiconductor substrate;
a conductive material having a landing portion and a connecting portion, the connecting portion connecting electrically to the transistor, the landing portion including a landing surface and a side surface, the landing surface having a concave section;
an etching stopper film surrounding the side surface of the landing portion, the etching stopper film having a window that is opened to expose at least a part of the landing surface;
a lower electrode covering an inner part of the window of the etching stopper film such that the etching stopper film contacts a side surface of the lower electrode, the lower electrode being in contact with the concave section of the landing surface, and the lower electrode further comprising a cup shape that includes an inner surface and an outer surface;
a capacitive insulating film formed on the side surface of the lower electrode, such that the etching stopper film is formed between the capacitive insulating film and the side surface of the landing portion of the conductive material; and
a plate electrode formed on the etching stopper film and the capacitive insulating film, such that the capacitive insulating film is formed between the side surface of the lower electrode and the plate electrode.

11. The semiconductor device according to claim 10, wherein the concave section is smaller in area than the landing surface.

12. The semiconductor device according to claim 10, wherein the side surface of the landing portion extends downwardly from the landing surface.

13. The semiconductor device according to claim 10, wherein the etching stopper film is in contact with at least a part of the side surface of the landing portion.

14. The semiconductor device according to claim 10, wherein the etching stopper film is elongated over a part of the landing surface of the lading portion to surround the lower electrode.

15. The semiconductor device according to claim 10, wherein a part of the lower electrode is embedded in the concave section of the landing surface.

16. The semiconductor device according to the claim 10, wherein at least a part of the conductive material contains a metal material.

17. The semiconductor device according to claim 10, further comprising an interlayer insulating film being disposed over the semiconductor substrate and having an upper surface, the etching stopper film being in contact with the upper surface of the interlayer insulating film.

18. A semiconductor device comprising:
a contact landing pad including a concave portion and a side portion having a thickness which is greater than a thickness of the concave portion;
an etching stopper film formed on the contact landing pad and including an opening;
a lower electrode including a bottom portion having a width which is less than a width of the contact landing pad, the bottom portion being formed in the opening of the etching stopper film and in the concave portion of the contact landing pad, such that the etching stopper film contacts a side surface of the lower electrode;
a capacitive insulating film formed on the side surface of the lower electrode, such that the etching stopper film is formed between the capacitive insulating film and the side portion of the contact landing pad; and
a plate electrode formed on the etching stopper film and the capacitive insulating film, such that the capacitive insulating film is formed between the side surface of the lower electrode and the plate electrode.

19. The semiconductor device of claim 18, wherein the lower electrode comprises:
a first storage electrode including the bottom portion;
an electrode landing pad formed at an end of the first storage electrode that is opposite the bottom portion and comprising a concave portion, the electrode landing pad including a width which is greater than the width of the bottom portion; and
a second storage element comprising a cup shape and including a bottom portion which is formed in the concave portion of the electrode landing pad, the bottom portion including a width which is less than the width of the electrode landing pad.

20. The semiconductor device of claim 19, wherein the concave portion of the electrode landing pad is formed in a top surface of the electrode landing pad, and a diameter of the electrode landing pad gradually increases from a bottom of the electrode landing pad to the top surface of the electrode landing pad.

* * * * *